United States Patent [19]

Broder

[11] 3,996,067

[45] Dec. 7, 1976

[54] SILICON NITRIDE COATED, PLASTIC COVERED SOLAR CELL

[75] Inventor: Jacob D. Broder, Cleveland Heights, Ohio

[73] Assignee: The United States of America as represented by the National Aeronautics and Space Administration, Washington, D.C.

[22] Filed: Dec. 30, 1975

[21] Appl. No.: 645,508

[52] U.S. Cl. .................................. 136/89; 204/192
[51] Int. Cl.² ................... H01L 31/06; C23C 15/00
[58] Field of Search ...................... 136/89; 204/192

[56] References Cited

UNITED STATES PATENTS

| 3,411,050 | 11/1968 | Middleton et al. | 136/89 X |
| 3,533,850 | 10/1970 | Tarneja et al. | 136/89 |
| 3,658,596 | 4/1972 | Osborne | 136/89 |
| 3,780,424 | 12/1973 | Forestieri et al. | 29/572 |
| 3,912,540 | 10/1975 | Broder | 136/89 |

OTHER PUBLICATIONS

G. J. Kominiak, "Silicon Nitride Films by Direct RF Sputter Deposition," *J. Electrochem. Soc.*, vol. 122, No. 9, pp. 1271–1273 (1975).

J. Chin et al, "Preparation of $Si_3N_4$ Coatings by Ion Plating," *J. Vac. Sci Technol;* vol. 12, No. 4, July/Aug. 1975, pp. 821–825.

A. F. Ratajczak et al, "Status of FEP Encapsulated Solar Cell Modules used in Terrestrial Applications," *Proceedings ninth Intersociety Energy Conversion Engineering Conference*, San Francisco, Aug., 1974, pp. 370–376.

*Primary Examiner*—John H. Mack
*Assistant Examiner*—Aaron Weisstuch
*Attorney, Agent, or Firm*—N. T. Musial; G. E. Shook; John R. Manning

[57] ABSTRACT

A non-oxide anti-reflective coating is used with a transparent plastic cover of fluorinated ethylene propylene copolymer on a silicon solar cell to increase the resistance to damage caused by electron bombardment.

7 Claims, 2 Drawing Figures

SILICON NITRIDE COATED, PLASTIC COVERED SOLAR CELL

ORIGIN OF THE INVENTION

The invention described herein was made by an employee of the United States Government and may be manufactured and used by or for the Government for governmental purposes without the payment of any royalties thereon or therefor.

BACKGROUND OF THE INVENTION

This invention is concerned with improving space power systems which utilize solar cells. The invention is particularly directed to an improved solar cell having a non-oxide anti-reflective coating thereon and a transparent plastic cover.

Silicon solar cells used in space power systems are coated with an anti-reflective coating and the covered with a protective glass cover. As presently constructed, the glasses are mounted using an ultra-violet sensitive adhesive which, in turn, requires the use of an ultra-violet filter on the underside of the glass. This structure results in a decrease in the current output of the solar cells.

It has been proposed that a transparent plastic material, such as a fluorinated ethylene propylene copolymer, be utilized instead of the glass cover. This plastic material is defined in U.S. Pat. No. 2,946,763. It is relaively insensitive to ultra-violet damage and can be heat bonded directly to the cell.

While the resulting structure represents an improvement over a conventionally covered cell, a fluorinated ethylene proplyene copolymer covered solar cell which has been coated with silicon monoxide has shown a degree of damage when exposed to electron bombardment. The damage results initially in the lifting of the fluorinated ethylene propylene copolymer from the cell and subsequent embrittlement of the plastic material. This damage can be attributed to two mechanisms: (1) The bombardment of the FEP plastic material results in the release of some active form of fluorine which can attack the SiO coating. This causes the removal of the anti-reflection coating and subsequent separation of the FEP plastic material from the cell; (2) Oxygen released in this reacton then reacts with the free radicals of the fluorinated ethylene propylene copolymer. This causes degradation and embrittlement of the FEP plastic material.

SUMMARY OF THE INVENTION

These problems have been solved by utilizing a nonoxide antireflective coating in conjunction with the fluorinated ethylene propylene copolymer plastic cover. An anti-reflective coating of $Si_3N_4$ is deposited on the surface of the silicon solar cell instead of the conventional coating of SiO.

OBJECTS OF THE INVENTION

It is, therefore, an object of the present invention to improve space power systems by providing solar cell packages that are more resistant to radiation damage.

Another object of the invention is to provide an improved covered solar cell package that is more resistant to damage caused by electron bombardment.

Another object of the invention is to provide a non-oxide anti-reflective coating for use in conjunction with transparent plastic covers for silicon solar cells.

These and other objects of the invention will be apparent from the specification which follows and from the drawing wherein like numerals are used throughout to identify like parts.

DESCRIPTION OF THE PREFERRED EMBODIMENT

Figure 1:
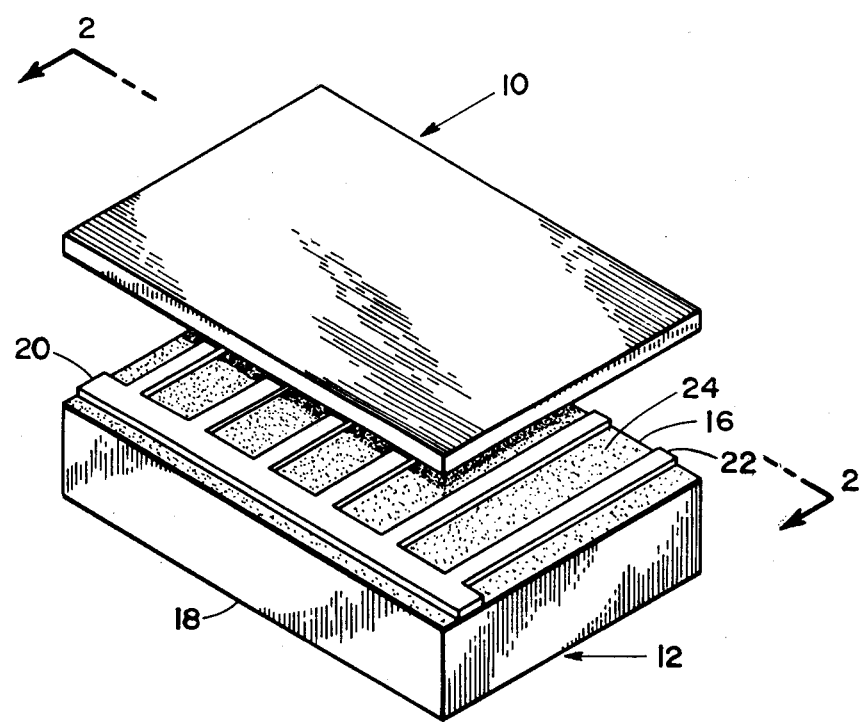
FIG. 1 is a perspective view of a solar cell assembly prior to attaching a cover.
Figure 2:
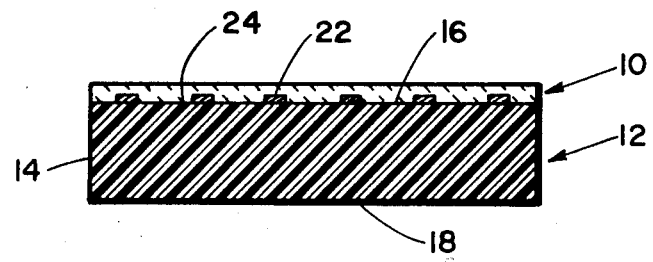
FIG. 2 is a vertical section view of the assembly shown in FIG. 1 taken along the line 2—2 showing a solar cell covered in accordance with the present invention.

Referring now to the drawings, a transparent plastic cover 10 and solar cell 12 are assembled in the manner shown in FIG. 1. This assembly is then bonded together to form a covered solar cell, as shown in FIG. 2.

The solar cell 12 is formed from a wafer 14 of silicon material into which a juncton has been diffused. Electrical contact is made to both the top surface 16 and bottom surface 18 of the wafer 14. A main contact 20 and grid fingers 22 are formed on the top surface 16.

A transparent plastic cover 10 having a thickness of about 5 mils has been satisfactory. A fluorinated ethylene propylene copolymer, more particularly an interpolymer of tetrafluoroethylene and hexafluoropropylene described in U.S. Pat. No. 2,946,763 and known commercially as Teflon FEP, has been successfully utilized as a transparent cover.

According to the present invention an anti-reflection coating 24 of a non-oxide material is applied to the top surface 16 of the wafer 14. Silicon nitride has been successfully used in the coating with the aforementioned fluorinated ethylene propylene copolymer plastic cover.

An important beneficial technical effect obtained in using $Si_3N_4$ instead of the conventional SiO is that even if the $Si_3N_4$ coating is as susceptible to fluorine attacked as SiO, the non-oxide material will not liberate oxygen to cause the embrittlement of the fluorinated ethylene propylene copolymer plastic cover 10. It has been found that no significant loss in current is experienced when $Si_3N_4$ is sputtered onto a solar cell when compared with a standard SiO evaporated coating. After laminating the 5 mil fluorinated ethylene propylene copolymer cover onto the silicon nitride coated cells, no reduction in current was experienced.

Exposure to a total dosage of $1 \times 10^{16}$ MeV electron/cm² in vacuum did not result in any separation of the fluorinated ethylene propylene copolymer cover from the cells nor was there any change in the color of the cells.

In certain instances some cracking of the plastic cover was observed. Storage in a rough vacuum for periods up to 5 months did not reveal any further visible deterioration of the FEP plastic material. Upon removal from the vacuum system, it was found that the FEP plastic material could be removed only by probing and then only directly under the probe.

While the preferred embodiment has been shown and described, various structural modifications and alterations may be made without departing from the spirit of the invention or the scope of the subjoined claims.

What is claimed is:

1. A covered solar cell consisting essentially of
a wafer of semiconductor material having a junction diffused therein, an electrical contact on the upper surface of said wafer,
a silicon nitride anti-reflection coating on said surface of said wafer, and
a transparent plastic cover of a fluorinated ethylene propylene copolymer bonded to said non-oxide anti-reflective coating.

2. A covered solar cell as claimed in claim 1 wherein the transparent plastic cover has a thickness of about 5 mils.

3. A covered solar cell as claimed in claim 1 wherein the wafer is a silicon semiconductor material.

4. A covered solar cell as claimed in claim 1 wherein the transparent plastic cover is an interpolymer of tetrafluoroethylene and hexafluoropropylene.

5. In combination with a solar cell for use in space
a silicon nitride antireflection coating on the upper surface of said solar cell, and
a transparent plastic cover of an interpolymer of tetrafluoroethylene and hexafluoropropylene bonded to said coated surface.

6. A solar cell as claimed in claim 5 wherein the solar cell comprises a wafer of silicon material into which a junction has been diffused.

7. A solar cell as claimed in claim 5 wherein the transparent plastic cover has a thickness of about 5 mils.

* * * * *